United States Patent [19]

Lipman et al.

[11] Patent Number: 5,010,470
[45] Date of Patent: Apr. 23, 1991

[54] CURRENT BALANCING STRUCTURE FOR SEMICONDUCTOR SWITCHING DEVICES

[75] Inventors: Kenneth Lipman; Douglas G. Young, both of West Hartford, Conn.

[73] Assignee: International Fuel Cells, Windsor, Conn.

[21] Appl. No.: 496,278

[22] Filed: Mar. 20, 1990

[51] Int. Cl.$^5$ .......................................... H02M 7/5387
[52] U.S. Cl. .................................. 363/132; 307/254; 323/272
[58] Field of Search ...................... 363/69, 75, 98, 132; 307/254; 323/272

[56] References Cited

U.S. PATENT DOCUMENTS

| | | | |
|---|---|---|---|
| 3,699,358 | 10/1972 | Wilkinson | 307/242 |
| 4,201,957 | 5/1980 | Cathell | 363/132 |
| 4,567,379 | 1/1986 | Corey et al. | 307/254 |

Primary Examiner—William H. Beha, Jr.
Attorney, Agent, or Firm—McCormick, Paulding & Huber

[57] ABSTRACT

A current balancing structure in which an alternating current output is produced by alternately connecting a DC potential to an output voltage bus through the switching action of a paralleled array of semiconductor devices forces equal current to flow through each device. During switching intervals, some semiconductor devices may "turn-on" or "turn-off" faster than others thus possibly forcing any conductive devices to carry a much higher current than when all the devices are conducting. Diodes protect the conductive devices by providing alternative circuit path to a DC reference potential voltage bus when one device becomes non-conductive before another paralleled device.

7 Claims, 2 Drawing Sheets

CURRENT BALANCING STRUCTURE FOR SEMICONDUCTOR SWITCHING DEVICES

BACKGROUND OF THE INVENTION

The present invention relates generally to power system circuits and deals more particularly with a current balancing structure for a number of semiconductor switching devices operating in parallel.

Power converters, for example, in the 100 to 500K W range have generally been implemented through the use of thyristor semiconductor devices such as silicon controlled rectifiers (SCR). Typically the SCR's are arranged in parallel arrays and each individual SCR carries a share of the total current being switched in the power converter circuit thus providing an electrical current capacity beyond that of a single SCR. Although thyristor semiconductor devices provide substantial current handling capabilities and can withstand high voltages, such as those developed during switching in inductive circuits, they have a number of inherent disadvantages which limit power converter circuit design.

Power converter circuits employing SCR's generally require relatively complex commutation circuits to insure that the SCR's "turn-on" and "turn-off" by applying gating signals that are precisely controlled and applied for a sufficient interval to insure the build up of current through the device to a value several times the holding current of the device and accordingly, high frequency operation is limited.

Another problem associated with thyristor semiconductor devices which limits the switching frequency of a power converter circuit design with such devices is the false "turn-on" of the device when the minimum rate of rise of the forward voltage when the device is in the OFF state exceeds the rating of the device falsely causing the device to switch from the OFF state to the ON state.

The advent and availability of high power transistor devices has made it possible to design and build power converters in the 100 to 500K W range. However, the current requirements of such power converter circuits are such that a number of transistors must be operated in parallel each handling a share of the total current. The application of these high power transistor devices are limited by base drive requirements of up to 10% of the rated current and voltage breakdown limitations occurring upon "turn-on" and "turn-off".

Despite the above limitations, there are a number of advantages to utilizing high power transistor devices among which advantages are: the ability to control the switching of the devices without complex commutation circuits since the transistor device "turns-off" upon removal of the base drive, and due to the high speed switching capability, a power converter circuit is able to work at high frequencies in the 10's of Kilohertz (Khz).

Due to the high switching frequency capabilities of the high power transistors, it is now possible to build a power converter circuit using a single three phase bridge in comparison to two or more modules required when such circuits are made using thyristors or gate "turn-off" thyristor devices.

In order for the design of a single three phase bridge power converter system to be cost effective and economical, it is desirable to drive the number of parallel transistors from a single drive source. However, in order for the transistors to be driven from a single source their emitters must generally be connected together and conventional current sharing arrangements such as inserting impedances in series with the transistor cannot be used.

Furthermore, semiconductor devices, including transistors, exhibit a range of nonuniform characteristics even if fabricated from the same batch. Thus, to equalize current distribution between and through each of the parallel transistors requires that the devices be matched and which matching is a cumbersome and expensive process. In addition, it would be necessary to match replacement devices and keep these replacement devices in maintenance stock for any usage in subsequent failures.

It is known to use a current sharing network to balance the current flowing through the parallel semiconductor devices and typically balancing reactors having primary and secondary windings wound around a magnetic core are used in the power converter switching circuitry to ensure current balancing among parallel switching devices. Briefly, the magnetic flux induced in the reactor core due to current flowing in the primary and secondary windings is in opposite directions from one another so that equal currents in the primary and secondary windings cause the resulting magnetic flux produced by these currents to cancel producing zero total flux. When the currents are unequal, a non-zero total magnetic flux is induced in the windings which tends to reduce the higher current in one parallel path while raising the lower current in another parallel path thus tending to equalize the currents in their respective primary and secondary windings of the reactor in each path. Consequently, substantially equal current flows through each of the parallel semiconductor devices even though the voltage drop characteristics may be different. Reference may be made to any number of texts and reference literature known to those skilled in the art for further details of such balancing structures.

Although current balancing is possible and indeed achievable during steady state conditions, attention must be paid to the interval during which the transistors are "turned-on" or "turned-off" in response to control signals applied to the respective transistor gates. Applying the gate control signals simultaneously to all the transistors does not guarantee a simultaneous "turn-on" of all the respective transistors and likewise the removal of the control signals from each of the respective transistor gates does not ensure that the transistors will simultaneously "turn-off". Accordingly, damage or destruction of the transistors may result if the current ratings are exceeded and further if a voltage transient produced due to switching in the inductive circuit exceeds the voltage rating of the transistor devices.

Accordingly, it is a general aim of the present invention to provide a current balancing structure that provides protection for parallel transistor devices from potentially damaging high voltage transients arising during the transistor "turn-on" and "turn-off" times wherein the respective transistors may not simultaneously "turn-on" and "turn-off".

It is a further aim of the present invention to provide a current balancing structure that insures substantially equal current flow in each of the respective parallel transistors.

SUMMARY OF THE INVENTION

The present invention resides in an electrical current balancing structure that in one embodiment includes first and second reference voltage buses where one of the first and second reference voltage busses defines an output voltage bus. The balancing structure also includes a plurality of individual semiconductor switching devices electrically connected in parallel to one another between the first and second reference voltage busses. Each of the individual semiconductor switching devices has a conductive state and a non-conductive state wherein each device selectively conducts an electric current from the first reference voltage bus to the second reference voltage bus when in its conductive state.

The balancing structure also includes magnetic current balancing means connected one-for-one in series between each of the semiconductor switching devices and the one of the first and second reference voltage busses defining the output voltage bus. The balancing means forces equal currents to flow through the individual semiconductor switching devices that are in the conductive state.

The balancing structure also includes a third reference voltage bus and diode means connecting the third voltage bus at a junction formed by the series connection between each of the semiconductor switching devices and the balancing means and in a polarity such that an electric current can flow between the balancing means and the third reference voltage bus in response to one or more of the individual semiconductor switching devices being in a non-conductive state at substantially the same time that one or more of the semiconductor switching devices are in a conductive state so that the sum of currents flowing through all of the conductive semiconductor switching devices is less than the current flowing in the one of the first and second reference voltage busses defining the output voltage bus.

Excessive voltage transients and currents that may be present due to non-simultaneous "turn-on" or "turn-off" of paralleled semiconductor switching devices are substantially eliminated by providing an electrical circuit path through a diode to the reference voltage bus to clamp the magnitude of a voltage transient appearing at the switching device to the magnitude of a voltage potential appearing on the reference voltage bus.

BRIEF DESCRIPTION OF THE DRAWINGS

Other features and advantages of the present invention will become readily apparent from the following description and figures wherein.

DETAILED DESCRIPTION OF THE PREFERRED EMBODIMENT

Figure 1:
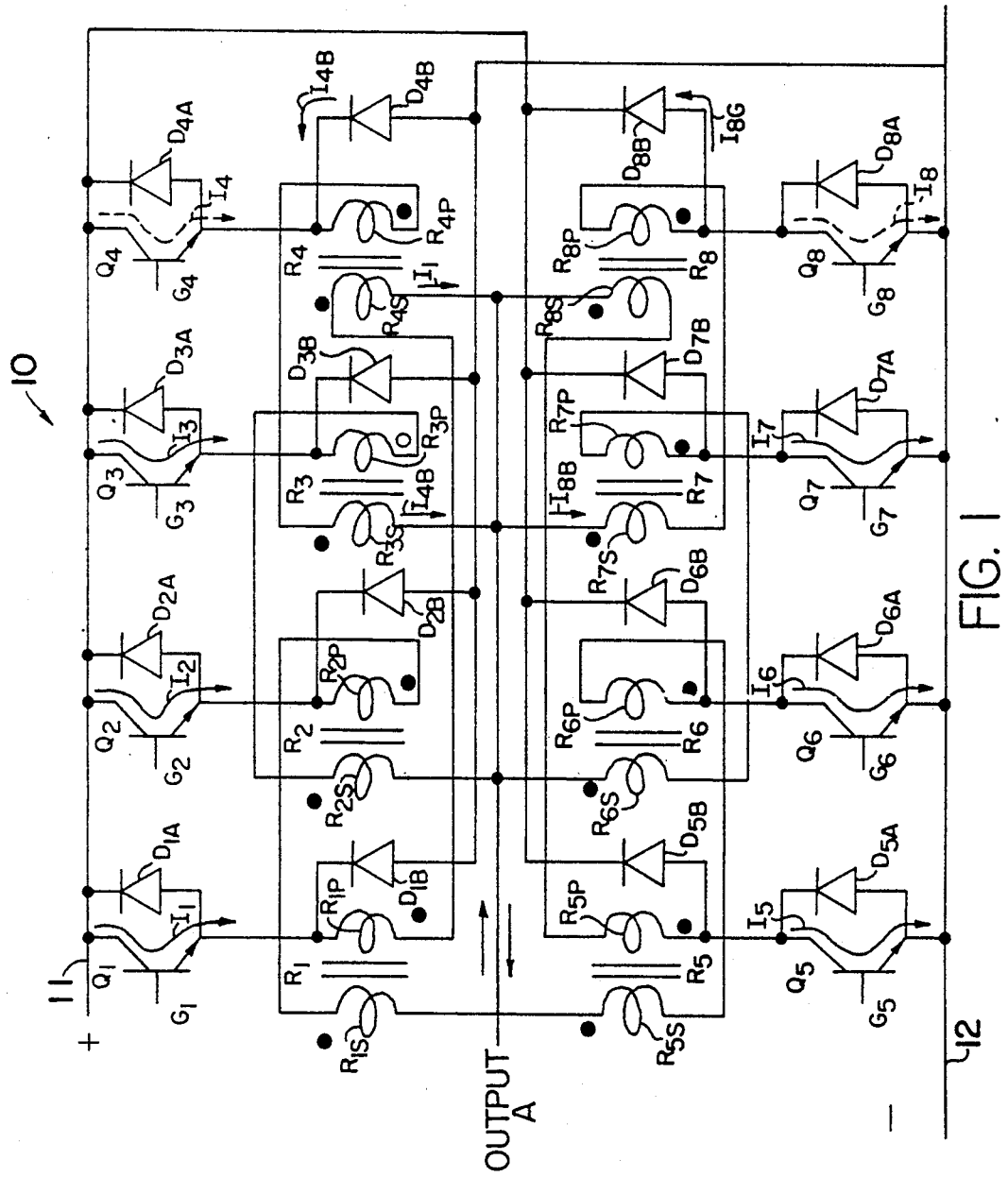
FIG. 1 is a schematic diagram of a current balancing circuit in accordance with the present invention.

Referring to FIG. 1, a transistor current balancing structure in accordance with the present invention is shown generally at 10. The current balancing structure 10 may be used as part of a circuit to produce one phase of a multi-phase inverter bridge and produce a full wave AC output by alternately connecting positive and negative DC supply buses 11 and 12 respectively, to an output A. A half wave AC output can also be produced by connecting only one DC supply at intervals to the output.

To produce a positive output voltage, the positive supply bus 11 is connected to the output A by the switching action of paralleled power transistors $Q_1$, $Q_2$, $Q_3$ and $Q_4$. The total current flowing to the output A is distributed between the transistors $Q_1-Q_4$ and flows when the transistors $Q_1-Q_4$ are conductive in response to enabling signals applied simultaneously to their respective gates $G_1-G_4$.

The transistor conditions to consider in producing one AC half cycle include a transitory "turn-on" switching condition when the transistor becomes conductive and the potential of the voltage at the output becomes positive, a "steady-state" condition during the time the transistor remains conductive and a transitory "turn-off" switching interval when the transistor becomes non-conductive and the potential of the output voltage drops to zero.

As briefly discussed above, the differing forward voltage characteristics of each transistor may result in unbalanced current loads and forced current sharing may be achieved by four "daisy chained" magnetic reactors $R_1$, $R_2$, $R_3$ and $R_4$. Each reactor $R_n$ has a primary winding $R_{nP}$ and a secondary winding $R_{nS}$ wound around a core and both windings have input and output leads. The phase relationship of the windings, as illustrated by the dot convention in FIG. 1, causes opposing magnetic fluxes to be produced in the core by currents entering the input leads of the primary and secondary windings. When the currents in the primary and secondary windings of a reactor are equal, opposing equal fluxes are produced that cancel one another. When one current exceeds the other, a net flux is induced that tends to raise the lower current and lower the higher current. The emitter of each transistor $Q_1$, $Q_2$, $Q_3$ and $Q_4$ is connected respectively to the non-dot input lead of one respective primary winding $R_{1P}$, $R_{2P}$, $R_{3P}$ and $R_{4P}$. The dotted output lead of each primary winding $R_{1P}$, $R_{2P}$, $R_{3P}$ and $R_{4P}$ is connected to a respective dotted input lead of a secondary winding $R_{1S}$, $R_{2S}$, $R_{3S}$ and $R_{4S}$ of a reactor other than its own to form the chain. The currents passing through the primary and secondary windings of the reactors $R_1-R_4$ and hence the currents passing through transistors $Q_1-Q_4$ will thus tend to be equal.

If all transistors do not respond simultaneously to gate signals during a transitory "turn-on" or "turn-off" switching condition, the total current will be distributed over less than the total number of paralleled transistors, in this case, $Q_1-Q_4$. As a result of unequal "turn-on" and "turn-off" characteristics, conductive transistors may carry current up to approximately 10% higher than normal and during the transitory switching conditions the non-conductive transistors may experience high transient inductive voltages. To prevent high currents and to protect the transistors from high transient voltages during the transitory switching conditions, a number of diodes $D_{1B}$, $D_{2B}$, $D_{3B}$ and $D_{4B}$ are used to connect the negative DC bus 12 to an input of an associated primary winding $R_{1P}$, $R_{2P}$, $R_{3P}$ and $R_{4P}$ respectively and provide an alternate path through which current can enter an associated reactor to reduce the high unequal current that would otherwise be carried by the conductive transistors and to reduce the high voltage developed across the reactor since current cannot change instantaneously in an inductive device.

Transistors $Q_1$, $Q_2$, $Q_3$ and $Q_4$ are "turned-on" by applying gate signals $G_1$–$G_4$ simultaneously. Since transistors $Q_1$–$Q_4$ are assumed to have varying characteristics, they accordingly do not simultaneously "turn-on" at once. For example, transistors $Q_1$–$Q_3$ could "turn-on" before $Q_4$. In the prior art current sharing structures, damage or destruction of the conductive transistors could be caused by this non-simultaneous "turn-on".

As seen in FIG. 1, in the present invention a supplemental current $I_{4B}$ is drawn into the reactor network from the negative voltage bus 12 through diode $D_{4B}$. The current is drawn into the reactor network by virtue of the current I1 passing through transistor $Q_1$, reactor $R_1$ and the secondary winding $R_{4S}$ of reactor $R_4$. Since initially a much greater current flows through the winding $R_{4S}$ than through the winding $R_{4P}$, a magnetic flux is induced in the reactor $R_4$ that causes the potential at the non-dot terminal of winding $R_{4P}$ to become negative with respect to the negative DC bus 12. Diode $D_{4B}$ thus becomes forward biased allowing the current $I_{4B}$ to flow into the reactor primary winding $R_{4P}$, through secondary winding $R_{3S}$ and into the output A. The current carried by each conducting transistor $Q_1$–$Q_3$ is thus greatly reduced while the output current A remains substantially the same irrespective of how many transistors are conducting at any one time.

Figure 2A:
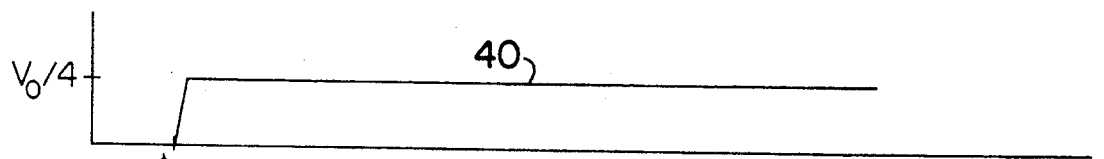
FIG. 2a shows the collector-to-ground voltage waveform of transistor Q1 in response to gate signals applied at time t1.
Figure 2B:
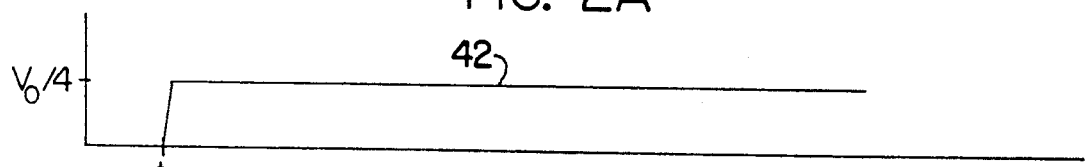
FIG. 2b shows the collector-to-ground voltage waveform of transistor Q2 in response to gate signals applied at time t1.
Figure 2C:
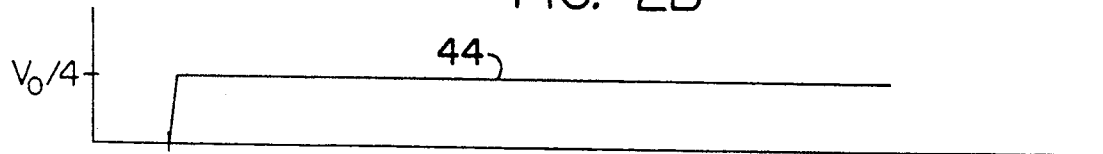
FIG. 2c shows the collector-to-ground voltage waveform of transistor Q3 in response to gate signals applied at time t1.
Figure 2D:
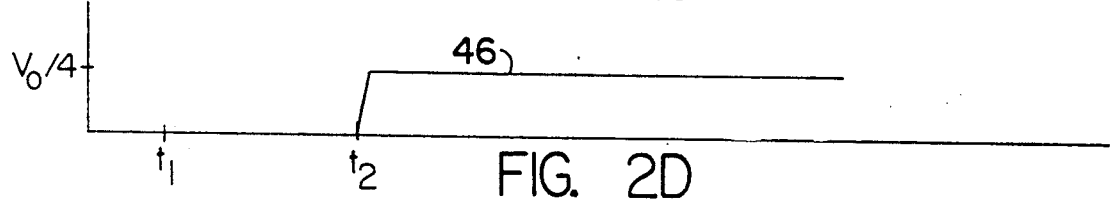
FIG. 2d shows the collector-to-ground voltage waveform of transistor Q4 in response to gate signals applied at time t1.
Figure 3:
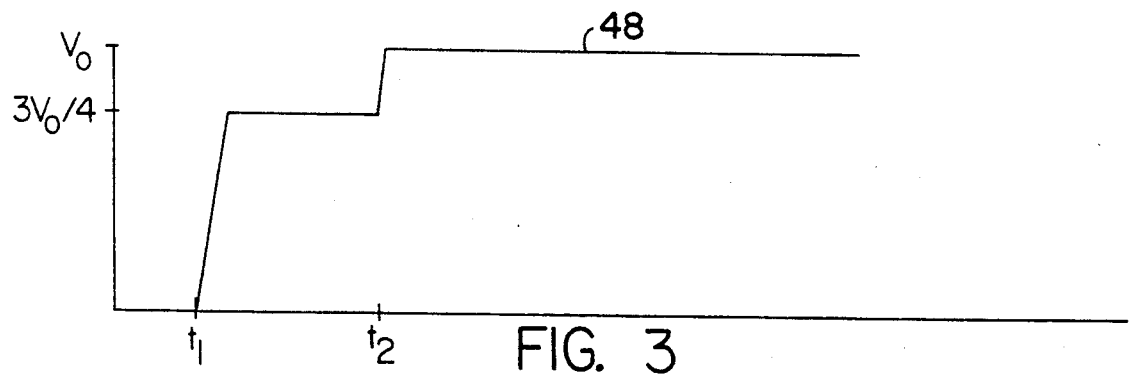
FIG. 3 shows the output voltage waveform resulting from the transistor voltages shown in FIGS. 2a–2d.

The output voltage is however, lower than the input voltage by approximately ¼ since the forward voltage drop of diode $D_{4B}$ clamps the transistor voltage. Thus the output power is reduced by approximately ¼ even though the output current remains at a full level. The collector-to-ground voltages of the transistors $Q_1$–$Q_4$ are shown graphically in FIGS. 2a–2d respectively and assume that gate voltage signals $G_1$–$G_4$ are applied simultaneously at time $t_1$. The voltages 40, 42, and 44 on transistors $Q_1$, $Q_2$ and $Q_3$ respectively immediately rise at time $t_1$ to a level of ¼ the maximum output $V_o$. As can be seen in FIG. 2d, until time $t_2$ when transistor $Q_4$ finally becomes conductive, the voltage drop 46 across the transistor $Q_4$ is clamped to no greater than $-1.2$ volts by the voltage drop across diode $D_{4B}$. The magnitude of the output voltage 48 in FIG. 3 is limited to ¾ the maximum output voltage until transistor $Q_4$ becomes conductive at time $t_2$. When transistor $Q_4$ does become conductive, current $I_4$ flows through the transistor and into the reactor $R_{4P}$. The forward bias is removed from the diode $D_{4B}$ and current $I_{4B}$ ceases to flow. The voltage drop on the transistor $Q_4$ rises to ¼ $V_o$ and the output voltage $V_o$ rises accordingly.

The same principle of operation as described above also applies during the transistor "turn-off" switching period. Referring to FIG. 1, in the present invention, if any of the transistors remain conductive longer than the others, a supplemental current enters the network through the diode $D_{nb}$ associated with the non-conductive transistor(s) $Q_n$ since the current through the series reactor cannot change instantaneously even though the voltage across the transistor has changed substantially instantaneously. Because the diode is clamped to the opposite voltage supply bus, energy which, in the absence of the invention would be a high voltage transient, is returned or redirected to the supply. Thus there is no need for snubbing circuits to dissipate energy and thereby increasing efficiency of the circuit.

In addition, since current continues to flow in the reactor, balancing is maintained and the conductive transistors do not carry any substantially higher currents and the risk of damage or destruction due to exceeding the rated current and voltage of the transistors is removed.

A negative voltage output waveform is created subsequent to the positive output wave form by removing the respective gate voltage signals $G_1$–$G_4$ from transistors $Q$–$Q_4$ thereby turning them off and turning on transistors $Q_5$–$Q_8$ by applying the respective gate voltage signals $G_5$–$G_8$. Conductive transistors $Q_5$–$Q_8$ now provide a completed circuit path from the negative DC bus 12 to the output A. Forced current sharing amongst the transistors is accomplished by reactors $R_5$–$R_8$, each of which has primary and secondary windings $R_{5P}$–$R_{8P}$ and $R_{5S}$–$R_{8S}$, respectively and which are configured correspondingly to the windings in the reactors $R_1$–$R_4$. The direction of current flow is from the output A into the respective dotted input leads of the primary windings $R_{5P}$–$R_{8P}$, through the series secondary windings $R_{5S}$–$R_{8S}$ wired as shown in FIG. 1 and then through respective transistors $Q_5$–$Q_8$. If during the switching "turn-on" interval, only transistors $Q_5$, $Q_6$ and $Q_7$ become conductive immediately, then currents $I_5$, $I_6$ and $I_7$ will flow from the output A through transistors $Q_5$, $Q_6$ and $Q_7$. In prior known current sharing structures wherein three transistors of four become conductive immediately, the current that would otherwise flow through the fourth transistor is distributed between the three conductive transistors. The additional current could cause the current rating of any of the transistors to be exceeded causing damage or destruction of one or more of the transistors.

However, in the present invention as seen in FIG. 1, diodes $D_{5B}$–$D_{8B}$ provide alternate paths for current that otherwise could not flow through non-conductive transistors. Thus, in the above example where transistor $Q_8$ does not immediately become conductive, current $I_{8B}$ flows in the same fashion as if transistor $Q_8$ had been on; from the output and through secondary winding $R_{7S}$ and primary winding $R_{8P}$. The unequal currents within reactor $R_8$ cause the voltage potential at the dot end of primary winding $R_{8P}$ to become positive with respect to the positive DC bus 11. The current $I_{8B}$ hence flows through diode $D_{8B}$ and into the positive DC bus. The output current is thus shared over the four reactors and the current passing through transistors $Q_5$–$Q_7$ remains the same as if transistors $Q_8$ had been conducting. When the transistor $Q_8$ does become conductive, the forward bias is removed from the diode $D_{8B}$ which then "turns-off" and the current $I_8$ flows through the transistor $Q_8$.

Diodes $D_{5B}$–$D_{7B}$ likewise provide the same alternate current path should any number of the transistors $Q_5$–$Q_7$ respectively not "turn-off" or "turn-on" simultaneously with the other transistors. Diodes $D_{5B}$–$D_{8B}$ will protect the transistors $Q_5$–$Q_8$ during "turn-off" switching intervals in the same fashion as during "turn-on" switching intervals should any of the transistors remain conductive longer than others.

It can be seen that the diodes $D_{1B}$–$D_{8B}$ protect conductive transistors from high current levels irrespective of how many transistors are non-conductive. Thus extra paralleled transistors or transistors with high current ratings are not necessary since the circuit designer can be assured that transient high currents during switching intervals will be properly dealt with.

It is desirable to add anti-parallel diodes $D_{1A}$–$D_{8A}$ in parallel with the transistors $Q_1$–$Q_8$ to briefly conduct an out-of-phase portion of load current. High speed switching between the transistors $Q_1$–$Q_4$ and $Q_5$–$Q_8$ to generate a full wave AC output is complicated in that an inductive load will prevent instantaneous reversal of the load current. The transformed load current must thus flow through diodes $D_{1A}$–$D_{8A}$ and back into the DC supply until the load current can reverse. Such anti-paralleling diodes are well known in the art and a detailed explanation is not necessary to gain a full understanding of the present invention.

A current balancing structure for semiconductor switching devices has been described in a preferred embodiment. However, it will be appreciated that numerous changes and modifications may be had without departing from the scope and spirit of the invention. For example, any number of devices can be paralleled in accordance with the present invention. Furthermore, the present invention can be used in half wave inverters. Also, the present invention can be used with known balancing reactors that use one and not two windings to achieve current balancing. Consequently, the invention has been described by way of illustration rather than limitation.

What is claimed is:

1. An electrical current balancing structure comprising:
   a first reference voltage bus for carrying a first voltage potential;
   a second reference voltage bus for carrying a second voltage potential, one of said first and second reference voltage busses defining an output voltage bus, said second reference voltage bus carrying a voltage having a negative polarity relative to a voltage carried by said first reference voltage bus;
   a plurality of semiconductor switching devices electrically connected in parallel to one another between said first and second reference voltage busses, each of said semiconductor switching devices having a conductive state and a non-conductive state wherein each of said individual semiconductor switching devices selectively conducts an electric current from said first reference voltage bus to said second reference voltage bus when said respective switching devices are in said conductive state;
   magnetic current balancing means connected one-for-one in series between each of said individual semiconductor switching means and said one of said first and second reference voltage busses defining said output bus for causing equal current to flow through said respective individual semiconductor switching devices that are in said conductive state;
   a third reference voltage bus for carrying a third voltage potential, and
   a plurality of diode means for connecting said third reference voltage bus at a junction formed by the series connection between each of said semiconductor switching devices and said balancing means and in a polarity such that an electric current flows between said balancing means and said third reference voltage bus in response to one or more of said individual semiconductor switching devices being in said non-conductive state at substantially the same time that one or more of said individual semiconductor switching devices being in said conductive state, whereby the sum of currents flowing through all of said conductive semiconductor switching devices is less than the current flowing in said one of said first and second reference voltage busses defining said output voltage bus.

2. An electrical current balancing structure as defined in claim 1 wherein said magnetic current balancing means further comprise a plurality of current balancing reactors each having a primary winding and a secondary winding, each of said primary and secondary windings being wound around an associated core structure and each winding having an input lead and an output lead, one of the respective input and output leads of each primary winding being connected to a respective one of the input and output leads of a different one of said plurality of reactors and having a phase relationship such that the dot end of one primary winding connects to the dot end of a secondary winding, the other of said input and output leads of each respective secondary winding being connected to said one of said first and second reference voltage busses defining said output voltage bus.

3. An electrical current balancing structure as defined in claim 2 wherein said plurality of semiconductor switching devices comprise a plurality of transistors each of which have a collector terminal, an emitter terminal and a gate terminal, and
   said diode means comprise a plurality of diodes each of which have a cathode and an anode.

4. An electrical current balancing structure as defined in claim 3 wherein said second reference voltage bus further comprises said output voltage bus and the collector terminal of each of said plurality of transistors is connected to said first reference voltage bus and the emitter terminal of each of said plurality of transistors is connected one-for-one to the input lead of a respective primary winding wherein each of said plurality of transistors is connected in series with the primary winding of one of said plurality of reactors and the secondary winding of a different one of said plurality of reactors and each respective one of said primary winding input leads is connected to the cathode of a respective one of said plurality of diodes and each of the anodes of said plurality of diodes is connected to said third reference voltage bus.

5. An electrical current balancing structure as defined in claim 3 wherein said first reference voltage bus further comprises said output voltage bus and the emitter terminal of each of said plurality of transistors is connected to said second reference voltage bus and the collector terminal of each of said plurality of transistors is connected one-for-one to the output lead of a respective primary winding wherein each of said plurality of transistors is connected in series with the primary winding of one of said plurality of reactors and the secondary winding of a different one of said plurality of reactors and each respective one of said primary winding output leads is connected to the anode of a respective one of said plurality of diodes and each of the cathodes of said plurality of diodes is connected to said third reference voltage bus.

6. An electrical current balancing structure for at least two transistors each having an emitter, collector and gate terminal and arranged in a parallel configuration wherein the collector terminal of each of said at least two transistors is coupled to a DC voltage potential, said balancing structure comprising:
- a plurality of current balancing reactors, each of said plurality of current balancing reactors having a primary winding and a secondary winding, each of said primary and secondary windings being wound around core means and each winding having an input lead and an output lead, each of said respective primary winding output leads being connected one-for-one to a respective input lead of a secondary winding of a different one of said plurality of reactors and having a phase relationship such that the dot end of one primary winding connects to the dot end of a secondary winding and all of said secondary winding output leads being connected to an output voltage bus, each of said transistors of said at least two transistors having its respective emitter terminal coupled one-for-one to the input lead of a primary winding of a respective one of said plurality of reactors wherein each of said at least two transistors is connected in series with the primary winding of one reactor and the secondary winding of a second reactor;
- a reference voltage bus;
- a plurality of diodes each having an anode and cathode, each of said primary winding input leads being coupled one-for-one to the cathode of a respective one of said diodes and the anode of said diodes being coupled to said reference voltage bus, and
- one of said plurality of diodes associated with a corresponding one of said transistors becoming conductive and providing an electrical current circuit path between said reference voltage bus and the non-dot end of a primary winding of a reactor coupled to said associated corresponding transistor to clamp a voltage potential present on said reference voltage bus to said primary winding thereby limiting a voltage transient at said transistor when said transistor becomes non-conductive prior to the other of said transistors becoming non-conductive.

7. An electrical current balancing structure for at least two transistors each having an emitter, collector and gate terminal and arranged in a parallel configuration wherein the emitter terminal of each of said at least two transistors is coupled to a DC voltage potential, said balancing structure comprising:
- a plurality of current balancing reactors, each of said plurality of current balancing reactors having a primary winding and a secondary winding, each of said primary and secondary windings being wound around magnetic core means and having an input lead and an output lead, each of said respective primary winding output leads being connected one-for-one to a respective input lead of a secondary winding of a different one of said plurality of reactors and having a phase relationship such that the non-dot end of one primary winding connects to the non-dot end of a secondary winding and all of said secondary winding output leads being connected to an output voltage bus, each of said transistors of said at least two transistors having its respective collector terminal coupled one-for-one to the output lead of a primary winding of a respective one of said plurality of reactors wherein each of said at least two transistors is connected in series with the primary winding of one reactor and the secondary winding of a second reactor;
- a reference voltage bus;
- a plurality of diodes each having an anode and cathode, each of said primary winding output leads being coupled one-for-one to the anode of a respective one of said diodes and the cathode of said plurality of diodes being coupled to said reference voltage bus, and
- one of said plurality of diodes associated with a corresponding one of said transistors becoming conductive and providing an electrical current circuit path between said reference voltage bus and the dot end of a primary winding of a reactor coupled to said associated corresponding transistor to clamp a voltage potential present on said reference voltage bus to said primary winding thereby limiting a voltage transient at said transistor when said transistor becomes non-conductive prior to the other of said transistors becoming non-conductive.

* * * * *